(12) United States Patent
Murin et al.

(10) Patent No.: US 7,502,254 B2
(45) Date of Patent: Mar. 10, 2009

(54) METHOD FOR GENERATING SOFT BITS IN FLASH MEMORIES

(75) Inventors: Mark Murin, Kfar Saba (IL); Mark Shlick, Ganei Tikvah (IL)

(73) Assignee: Sandisk IL Ltd, Kfar Saba (IL)

( * ) Notice: Subject to any disclaimer, the term of this patent is extended or adjusted under 35 U.S.C. 154(b) by 235 days.

(21) Appl. No.: 11/651,483

(22) Filed: Jan. 10, 2007

(65) Prior Publication Data

US 2007/0237006 A1    Oct. 11, 2007

Related U.S. Application Data

(60) Provisional application No. 60/744,601, filed on Apr. 11, 2006.

(51) Int. Cl.
*G11C 11/03* (2006.01)
(52) U.S. Cl. .............................. 365/185.03; 365/185.05; 365/185.07; 365/185.26; 365/185.33
(58) Field of Classification Search ............ 365/185.03, 365/185.05, 185.07, 185.26, 185.33

See application file for complete search history.

(56) References Cited

U.S. PATENT DOCUMENTS

| | | | |
|---|---|---|---|
| 6,751,766 B2 | 6/2004 | Guterman et al. | |
| 6,807,104 B2 * | 10/2004 | Arai et al. .............. | 365/185.24 |
| 7,023,735 B2 | 4/2006 | Ban et al. | |
| 2005/0013165 A1 | 1/2005 | Ban | |
| 2008/0159005 A1 * | 7/2008 | Lee et al. ............... | 365/185.25 |

* cited by examiner

*Primary Examiner*—Pho M. Luu
(74) *Attorney, Agent, or Firm*—Davis Wright Tremaine LLP

(57) ABSTRACT

Information stored as physical states of cells of a memory is read by setting each of one or more references to a respective member of a first set of values and reading the physical states of the cells according to the first set. Then, at least some of the references are set to respective members of a second set of values, and the physical states of the cells are read according to the second set. At least one member of the second set is different from any member of the first set, so that the two readings together read the physical states of the cells with higher resolution than the first reading alone.

20 Claims, 3 Drawing Sheets

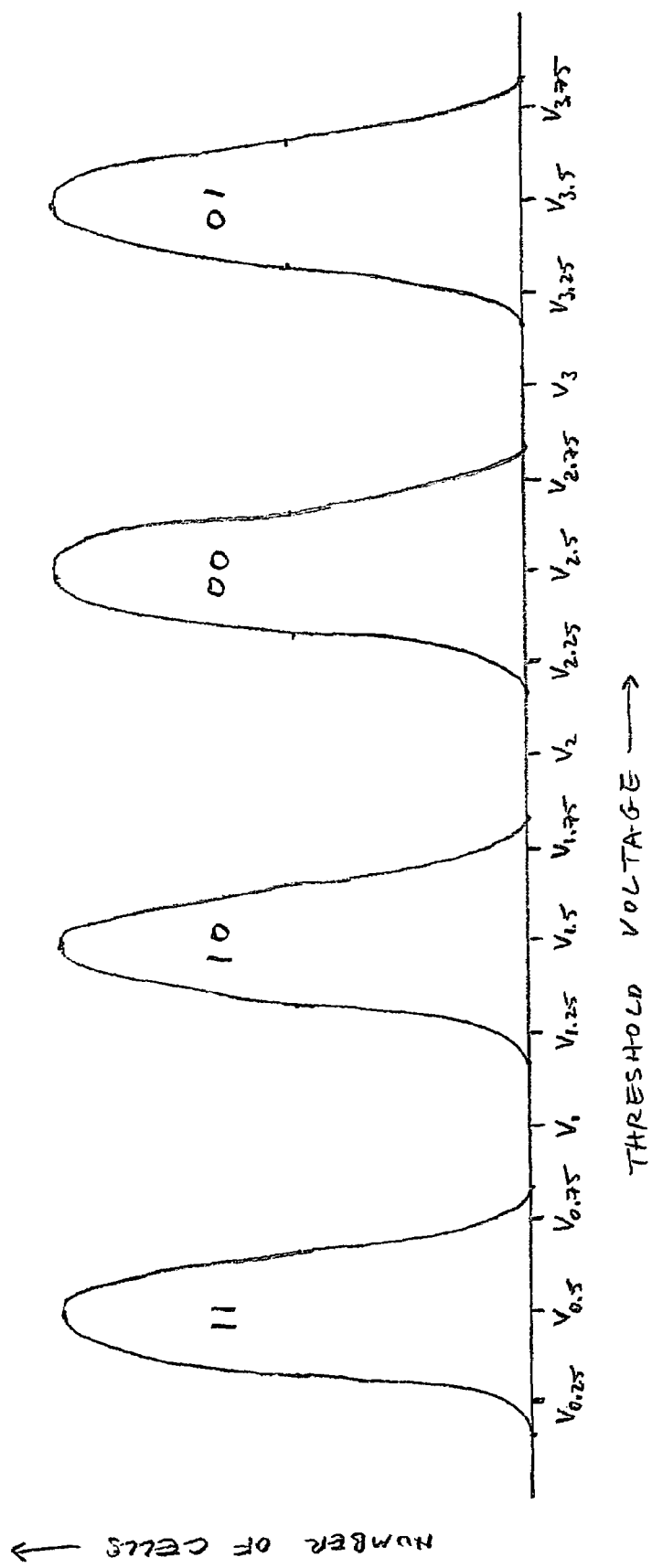

METHOD FOR GENERATING SOFT BITS IN FLASH MEMORIES

This patent application claims the benefit of U.S. Provisional Patent Application No. 60/744,601, filed Apr. 11, 2006

FIELD AND BACKGROUND OF THE INVENTION

The present invention relates to the reading of a memory such as a flash memory and, more particularly, to the generation of soft bits, e.g. for error correction, during such reading.

Flash memory devices have been known for many years. NAND-type flash memories differ from other types of flash memories (e.g. NOR), among other specific characteristics, by the fact that a certain number of information bits, written to the memory, may be read back "flipped", i.e. different from what these bits were as originally written to the memory.

In order to overcome this phenomenon and to make NAND memories usable by real applications, it is common to use Error Correction Codes (ECC) in conjunction with these memories. The following is a general principle of using ECC in Flash memories:

Before writing data to the memory, an ECC algorithm is applied to this data in order to compute additional (redundant) bits that are later used for error detection and correction. These redundant bits are often called "parity bits" or "parity", and a combination of the original data and the parity is called a "codeword".

The entire codeword (i.e. the original data and the parity) is recorded to the flash memory. It should be noted that the actual size of the NAND Flash memory is larger than the size of the original (application) data, and the NAND flash memory is designed to accommodate parity as well as the original data.

When the data are retrieved from the memory, the entire codeword is read, and an ECC algorithm is applied to the data and the parity in order to detect and correct possible "bit flips" (i.e., errors).

It should be noted that the implementation of the ECC may be done by hardware, by software or by a combination of hardware and software. Furthermore, ECC may be implemented within a memory, within a memory controller, within a host computer, or may be "distributed" among these parts of a system.

Most ECC algorithms that are used in conjunction with NAND Flash memories use the information stored in the memory device (both data and parity) for both detection of errors and correction of errors. The same number of information bits that were written to the memory are read out of the memory and are used for ECC calculations and decisions. This information is sometimes called "Hard Bits", to indicate a "hard" connection between the written data and the read data.

It is well known that the data stored in Flash memory is actually represented by certain discrete threshold voltage levels of memory cells. So, in Single Level Cell (SLC) devices, that store one bit per memory cell, actual data are represented by one of two threshold voltage levels per cell; in Multi-Level Cell (MLC) devices that store two bits per cell, actual data are represented by one of four threshold voltage levels per cell; and, generally, in MLC devices that store "n" bits in each cell, actual data are represented by one of $2^n$ threshold voltage levels per cell.

The process of reading data from a Flash memory cell consists of comparing the cell voltage to a set of pre-defined reference voltages, with a logical combination of the results of these comparisons determining the data as read from the cell. In standard Flash devices, storing "n" bits per cell, the number of such comparisons is $2^n$-1.

Because reference voltages are discrete, a cell of certain threshold voltage level has a data value assigned to this level. This is regardless of the actual cell threshold voltage, which may vary between the lower reference voltage and the upper reference voltage of a threshold voltage band that corresponds to the data value. Therefore, in the case of error, the cell threshold voltage value, as read from the Flash memory, may provide absolutely NO information about the possible original value of the cell threshold voltage level as written.

However, it is clear that if a cell's actual threshold voltage is closer to a lower reference voltage than to a higher reference voltage, then the probability of this cell representing a "lower" value is higher than the probability of the cell representing a "higher" value, and vice versa.

Let us consider, for example, two-bit-per-cell MLC device with the following reference voltage bands:

Band 0 (Erase)—<0 V
Band 1—between 0 V and 1.5 V
Band 2—Between 1.5 V and 3 V
Band 3—above 3 V In this device, a cell with a threshold voltage of 1.6 V is read as cell of Band 2, but has a higher probability of being originally of Band 1 than of being originally in Band 3. Similarly, a cell with a threshold voltage of 1.3 V, read as Band 1, has a higher probability of being originally in Band 2 than of being originally in the Erase state.

It is well known from Information theory that the more information available for the decision making, the more efficient and accurate is the decision making process. In our case, the more information we have on the cell state (cell threshold voltage, actually), the more efficient and accurate the error detection and correction algorithms will be.

From the above discussion it is clear, that in order to enhance ECC efficiency, more information on a cell threshold voltage than a "standard" reading of a cell state should be obtained. This is done by performing comparisons of a cell threshold voltage to additional reference voltages and thus reading of additional so called "soft" information (or "soft" bits) from the memory device. Considering the above mentioned example of two-bit-per-cell MLC Flash, comparison of a cell threshold voltage with additional reference voltages of, say, −0.75 V, 0.75 V, 2.25 V and 3.75 V (in addition to the "standard" 0, 1,5 and 3 V) generates one additional soft bit for each cell—a bit that then may be used in an enhanced ECC mechanism. Using a more "refined" set of reference voltages may, of course, generate additional soft bits in the device.

The use of soft bits in ECC is not new in the art. Consider for example U.S. Pat. No. 7,023,735, "METHODS OF INCREASING THE RELIABILITY OF A FLASH MEMORY" to Ban et al., which is incorporated by reference for all purposes as if fully set forth herein. This patent describes the use of soft bits, read from a Flash memory device, to enhance an ECC mechanism and so to increase Flash memory reliability.

However, in order to obtain these soft bits from the memory device, the device has to contain, in addition to support for additional reference voltages, lots of logic circuitry, control mechanisms to support additional reading (i.e. additional comparison cycles), as well as data registers to hold intermediate reading results. All these make the memory device more complicated and less optimal in the utilization of silicon, because the design of the internal structure of a Flash memory chip is optimized for memory cells, rather than for logic circuits.

There is thus a widely recognized need for, and it would be highly advantageous to have, a method of reading soft bits from a flash memory device designed for reading only hard bits, without substantial modification of the flash memory device.

The present invention is described below with reference to the prior art flash memory devices illustrated in FIGS. 1 and 2.

FIG. 1, that is modified from FIG. 1 of Guterman et al., U.S. Pat. No. 6,751,766, shows a self-contained flash memory device 10 that includes an array 12 of individually addressable flash memory cells arranged in a regular array of rows and columns. Individual memory cells are controlled by bit lines, select gates arranged in word lines, and steering gates. Bit lines extend along columns of array 12. Word lines extend along columns of array 12. A bit line unit 14 includes a bit line decoder, storage elements, driver circuits and sense amplifiers. Bit line unit 14 is coupled to array 12 by a line 16 and to a controller 18 by a bit-control line 20 and by a read line 22. A word line unit 24 includes a select gate decoder and driver circuits. Word line unit 24 is coupled to array 12 by a line 26 and to controller 18 by a word-control line 28. A steering unit 30 includes a steering gate decoder and driver circuits. Steering unit 30 is coupled to array 12 by a line 32, to controller 18 by a steering-control line 34 and to bit line unit 14 by a-line 36. Bit line unit 14, word line unit 24 and steering unit 30 collectively constitute the memory cell management circuitry 46 of device 10. Bit line unit 14, word line unit 24 and steering unit 30 are coupled to a bus 38 that in turn is coupled to controller 18. Controller 18 is coupled to a host 40 of device 10 by a line 42.

When a preselected memory cell is to be read, voltages are applied to the corresponding bit lines, word line and steering gates, corresponding to the preselected memory cell, at predetermined levels sufficient to enable the reading of the preselected memory cell. Controller 18 applies voltages of the bit lines through bit-control line 20. Controller 18 applies voltages of the word line through word-control line 28. Controller 18 applies voltages of steering gates through steering-control line 34. A current is generated through the preselected memory cell by these voltages. The current is indicative, in a SLC device 10, of whether or not the preselected memory cell was programmed, and in a MLC device 10, of which of the reference voltage bands the memory cell was programmed to. The value of the current is amplified and compared to reference currents by sense amplifiers in bit line unit 14. The results of the comparison are stored temporarily in latches or registers. The resultant data, read out from the preselected memory cell, are sent to controller 18 through read line 22.

FIG. 2 is a high-level partial block diagram of a data storage system 50 that includes a flash memory device 48. Data storage system 50 also includes a processor 52 and three more memory devices: a RAM 54, a boot ROM 56 and a mass storage device 58. Processor 52 and memory devices 48, 54, 56 and 58 communicate with each other via a common bus 66. Like flash memory device 10, flash memory device 48 includes a flash memory cell array 62 and memory cell management circuitry 60. Unlike flash memory device 10, flash memory device 48 lacks its own controller. Instead, processor 52 emulates controller 18 by executing an appropriate software driver that is stored in mass storage device 58 and that is loaded into RAM 54 for execution. Flash memory device 48 also includes a bus interface 64 to enable processor 52 to communicate with memory cell management circuitry 60.

SUMMARY OF THE INVENTION

According to the present invention there is provided a method of reading information stored as a respective physical state of at least one cell of a memory, the method including the steps of: (a) setting each of at least one reference to a respective member of a first set of values; (b) reading the respective physical state of each cell wherein the information is stored according to the first set of values; (c) subsequent to the reading of the respective physical state of each cell according to the first set of values: setting each of at least a portion of the at least one reference to a respective member of a second set of values; and (d) reading the respective physical state of each cell wherein the information is stored according to the second set of values; wherein at least one member of the second set is different from any member of the first set, so that the reading of the at least one physical state according to the first set and the reading of the at least one physical state according to the second set together read the at least one physical state with higher resolution than the reading of the at least one physical state according to the first set alone.

According to the present invention there is provided a memory device including: (a) at least one cell for storing information as a respective physical state thereof; and (b) a controller operative to read the information by: (i) setting each of at least one reference to a respective member of a first set of values, (ii) reading the respective physical state of the each cell, wherein the information is stored, according to the first set of values, (iii) subsequent to the reading of the respective physical state of the each cell according to the first set of values: setting each of at least a portion of the at least one reference to a respective member of a second set of values, and (iv) reading the respective physical state of the each cell, wherein the information is stored, according to the second set of values; wherein at least one member of the second set is different from any member of the first set, so that the reading of the at least one physical state according to the first set and the reading of the at least one physical state according to the second set together read the at least one physical state with higher resolution than the reading of the at least one physical state according to the first set alone.

According to the present invention there is provided a system including: (a) a memory that includes at least one cell for storing information as a respective physical state thereof; and (b) a processor operative to read the information by: (i) setting each of at least one reference to a respective member of a first set of values, (ii) reading the respective physical state of the each cell, wherein the information is stored, according to the first set of values, (iii) subsequent to the reading of the respective physical state of the each cell according to the first set of values: setting each of at least a portion of the at least one reference to a respective member of a second set of values, and (iv) reading the respective physical state of the each cell, wherein the information is stored, according to the second set of values; wherein at least one member of the second set is different from any member of the first set, so that the reading of the at least one physical state according to the first set and the reading of the at least one physical state according to the second set together read the at least one physical state with higher resolution than the reading of the at least one physical state according to the first set alone.

According to the present invention there is provided a method of reading information stored as a respective physical state of at least one cell of a memory, the method including the steps of: (a) configuring the memory to store, for each cell, at most $N \geq 1$ bits that are representative of the physical state of the each cell; and (b) for each cell wherein the information is stored: (i) storing in the memory a respective N first bits that represent the respective physical state of the each cell according to a first set of at least one reference value, and (ii) replacing, within the memory, at least a portion of the N first bits with at least one second bit that is representative of the physical state of the each cell according to a second set of at least one reference value, at least one member of the second set being different from any member of the first set, the N first bits and the at least one second bit together representing the physical state of the each cell with higher resolution than the N first bits alone.

According to the present invention there is provided a memory device including: (a) a memory including: (i) at least one cell for storing information as a respective physical state thereof, and (ii) memory cell management circuitry for storing, for each cell, at most a respective $N \geq 1$ bits that represent the respective physical state according to a set of at least one reference; and (b) a controller for (i) setting each of the at least one reference to a respective member of a first set of at least one value, (ii) subsequent to the setting of each at least one reference to the respective member of the first set: for each cell wherein the information is stored: reading the N respective bits, (iii) setting each of at least a portion of the at least one reference to a respective member of a second set of at least one value, at least one member of the second set being different from any member of the first set, and (iii) subsequent to the setting of each of at least the portion of the at least one reference to the respective member of the second set: for each cell wherein the information is stored: reading at least one of the N respective bits, thereby obtaining, for each cell wherein the information is stored, a representation of the respective physical state of higher resolution than a representation of the respective physical state according to only N bits.

According to the present invention there is provided a system including: (a) a memory including: (i) at least one cell for storing information as a respective physical state thereof, and (ii) memory cell management circuitry for storing, for each cell, at most a respective $N \geq 1$ bits that represent the respective physical state according to a set of at least one reference; and (b) a processor for: (i) setting each of the at least one reference to a respective member of a first set of at least one value, (ii) subsequent to the setting of each at least one reference to the respective member of the first set: for each cell wherein the information is stored: reading the N respective bits, (iii) setting each of at least a portion of the at least one reference to a respective member of a second set of at least one value, at least one member of the second set being different from any member of the first set, and (iii) subsequent to the setting of each of at least the portion of the at least one reference to the respective member of the second set: for each cell wherein the information is stored: reading at least one of the N respective bits, thereby obtaining, for each cell wherein the information is stored, a representation of the respective physical state of higher resolution than a representation of the respective physical state according to only N bits.

According to the present invention there is provided a method of reading information stored as a respective physical state of at least one cell of a memory, the method including the steps of: (a) configuring the memory to return, for each cell, in response to at least one read command, at most $N \geq 1$ bits that are representative of the physical state of the each cell; (b) setting each of at least one reference to a respective member of a first set of values; (c) issuing at least one of the at least one read command to obtain, for each cell, a first N bits that are representative of the physical state of the each cell according to the first set; (d) setting each of at least a portion of the at least one reference to a respective member of a second set of values, at least one member of the second set being different from any member of the first set; and (e) issuing at least one of the at least one read command to obtain, for each cell, at least one second bit that is representative of the physical state of the each cell according to the second set, the N first bits and the at least one second bit together representing the physical state of the each cell with higher resolution than the N first bits alone.

According to the present invention there is provided a memory device including: (a) a memory including: (i) at least one cell for storing information as a respective physical state thereof, and (ii) memory cell management circuitry for returning, in response to at least one read command, at most $N \geq 1$ respective bits that represent the physical state of each cell, wherein the information is stored; and (b) a controller for: (i) setting each of at least one reference to a respective member of a first set of values, (ii) issuing at least one of the at least one read command to obtain, for each cell wherein the information is stored, a first N bits that are representative of the physical state of the each cell according to the first set, (iii) setting each of at least a portion of the at least one reference to a respective member of a second set of values, at least one member of the second set being different from any member of the first set, and issuing at least one of the at least one read command to obtain, for each cell wherein the information is stored, at least one second bit that is representative of the physical state of the each cell according to the second set, thereby obtaining, for each cell wherein the information is stored, a representation of the respective physical state of higher resolution than a representation of the respective physical state according to only the first N bits.

According to the present invention there is provided a system including: (a) a memory including: (i) at least one cell for storing information as a respective physical state thereof, and (ii) memory cell management circuitry for returning, in response to at least one read command, at most $N \geq 1$ respective bits that are representative of the physical state of each cell wherein the information is stored; and (b) a processor for: (i) setting each of at least one reference to a respective member of a first set of values, (ii) issuing at least one of the at least one read command to obtain, for each cell wherein the information is stored, a first N bits that are representative of the physical state of the each cell according to the first set, (iii) setting each of at least a portion of the at least one reference to a respective member of a second set of values, at least one member of the second set being different from any member of the first set, and (iv) issuing at least one of the at least one read command to obtain, for each cell wherein the information is stored, at least one second bit that is representative of the physical state of the each cell according to the second set thereby obtaining, for each cell wherein the information is stored, a representation of the respective physical state of higher resolution than a representation of the respective physical state according to only the first N bits.

The method of the present invention are methods of reading information stored as respective physical states of one or more cells of a memory. In the case of a flash memory, the physical states of the cells are the respective threshold voltages of the cells.

According to the first basic method, each of one or more references is set to a respective member of a first set of values. For example, if the cells are flash memory cells, the reference(s) is/are (a) reference voltage(s) for reading the threshold voltage(s) of the cell(s). The respective physical state(s) of the cell(s) wherein the information is stored is/are read according to the first set of values. Subsequent to the reading according to the first set of values, one, some or all of the reference(s)

is/are set to (a) respective member(s) of a second set of values. Then the respective physical state(s) of the cell(s) wherein the information is stored is/are read again, this time according to the second set of values. At least one member of the second set of values is different from any member of the first set of values, so that reading the physical state(s) of the cell(s) according to both sets of values reads the physical state(s) of the cell(s) with higher resolution than reading the physical state(s) of the cell(s) according to just the first set of values.

Note that the physical state(s) of the cell(s) when read according to the second set of values are the same physical states(s) as they were when they were read according to the first set of values. This distinguishes this aspect of the present invention from e.g. US Patent Application Publication No. 2005/0013165, to Ban, that teaches re-setting reference voltages of a flash memory to compensate for the downward drift of cell threshold voltages.

Preferably, the two readings are effected using a common reading mechanism.

Preferably, the setting of the one or more references to its/their respective member(s) of the second set of values is effected by issuing commands to the memory from outside the memory. For example, in FIG. 1 the "memory" is considered to include memory cell array 12 and memory cell management circuitry 46 but not controller 18, so that the reference(s) is/are set to its/their respective member(s) of the second set of values by commands issued by controller 18. Similarly, in FIG. 2, the reference(s) is/are set to its/their respective member(s) of the second set of values by processor 52 that is outside memory device 48. Note that a "memory" as defined herein includes both a memory cell array such as memory cell array 12 or memory cell array 62 and memory cell management circuitry such as memory cell management circuitry 46 or memory cell management circuitry 60, but not a controller such as controller 18. A "memory device" as defined herein could be either just a memory or the combination of a memory and a controller.

Preferably, as in the second preferred embodiment below, every member of the second set of values is different from any member of the first set of values.

Preferably, the method also includes the step of, prior to the reading according to the first set of values, writing the information to the cell(s) according to the first set of values. That the information is written "according" to the first set of values means that the information is written with reference to a corresponding set of writing reference values that are selected so that the first reading can be done using the first set of reading reference values. For example, when flash cells are programmed (i.e., written), the reference values used for the programming are verify voltage levels that typically are equal in number to, and slightly higher in value than, the respective reference voltage values that are used for the first reading.

Preferably, the re-setting of one, some or all of the references and the subsequent re-reading of the cell(s) according to the re-set references are iterated. In each iteration subsequent to the first iteration, at least one member of the second set of values is different from any member of the second set of values in any preceding iteration. Most preferably, in each iteration subsequent to the first iteration, every member of the second set of values is different from any member of the second set of values in any preceding iteration. For example, in the second preferred embodiment below, in the first iteration the reference voltages are $V_{1.5}$, $V_{2.25}$ and $V_{3.5}$; in the second iteration the reference voltages are $V_{1.25}$, $V_{2.25}$ and $V_{3.25}$; and in the third iteration the reference voltages are $V_{1.75}$, $V_{2.750}$ and $V_{3.75}$.

Also most preferably, the method also includes the step of assigning a bit pattern to each of a plurality of intervals defined by the first set of values, such that the bit patterns together constitute a first Gray code, so that reading the physical state(s) of the cell(s) according to the first set of values expresses the information stored in each cell as a respective bit pattern of the first Gray code. Then the re-setting of one, some or all of the references and the subsequent re-reading of the cell(s) according to the re-set references are iterated a sufficient number of times to transform the first Gray code into a second Gray code with a greater number of bits than the first Gray code, with the respective physical state of each cell then being expressed as a respective bit pattern of the second Gray code. For example, in the first preferred embodiment below, the first Gray code is (11, 10, 00, 01). After two iterations, the second Gray code is (111, 110, 100, 101, 001, 000, 010, 011). After four more iterations, the second Gray code is (1111, 1110, 1100, 1101, 1001, 1000, 1010, 1011, 0011, 0010, 0000, 0001, 0101, 0100, 0110, 0111).

Preferably, as in the second preferred embodiment below, the second set of values includes as many members as the first set of values. Most preferably, the method also includes the steps of setting one of the reference(s) to a third value that is different from any members of the first and second sets and reading the physical state(s) of the cell(s) according to the third value. For example, in the second preferred embodiment below, if a soft bit is needed for the erased state, the controller could read the cell(s) using the reference voltages $V_{0.5}$, $V_{1.5}$ and $V_{2.5}$.

Preferably, if the first set of values includes N members, the second set of values includes (N+1)/2 members. This is a generalization of the first preferred embodiment below to a more-than-two-bits-per-cell MLC flash memory: the first set of values is the set of values used to read the hard bits of a $\log_2(N+1)$-bit-per-cell flash memory, and the second set of values, for reading the most significant soft bits, has the same number of values as are used to read the least significant hard bits: (N+1)/2.

Preferably, the method further comprises the step of interpreting results of both readings of the physical state(s) of the cell(s) to recover the information. This is the motivation of the present invention: in the preferred embodiments below, the first reading produces hard bits, and the second reading produces soft bits that may be used to correct errors in the hard bits.

According to the second method, the memory is configured to store, for each cell, at most $N \geq 1$ bits that are representative of the physical state of each cell. For example, in flash memory device 10 of FIG. 1 the latches or registers of bit line unit 14 are used to store these N bits. For each cell wherein the information is stored, a respective N first bits, that represent the physical state of the cell according to a first set of one or more references, are stored in the memory. Then, for each cell wherein the information is stored, at least a portion of the N first bits is replaced within the memory with one or more second bits that is/are representative of the (same) physical state of the cell according to a second set of one or more references. At least one member of the second set of values is different from any member of the first set of values. The N first bits and the one or more second bits represent the physical state of the cell with higher resolution than just the N first bits.

According to the third method, the memory is configured to return, for each cell, in response to one or more commands, at most $N \geq 1$ bits that are representative of the cell's physical state. Each of one or more references is set to a respective member of a first set of values. At least one of the read commands is issued to obtain, for each cell, a first N bits that are representative of the physical state of the cell according to the first set of values. Each of at least a portion of the reference(s) then is set to a respective member of a second set of values, with at least one member of the second set of values being different from any member of the first set of values. At least one of the read commands is issued to obtain, for each cell, one or more second bits that is/are representative of the (same) physical state of the cell according to the second set of values. The N first bits and the second bit(s) together represent the physical state of the cell with higher resolution than just the N first bits.

The scope of the present invention also includes memory devices that include memories and controllers for implementing the present invention, for example as illustrated in FIG. 1. The scope of the present invention also includes data storage systems that include memories and processors for implementing the present invention, for example as illustrated in FIG. 2.

BRIEF DESCRIPTION OF THE DRAWINGS

The invention is herein described, by way of example only, with reference to the accompanying drawings, wherein:

FIG. 3 illustrates the voltage bands of a four-level flash memory cell.

DESCRIPTION OF THE PREFERRED EMBODIMENTS

The principles and operation of a flash memory device according to the present invention may be better understood with reference to the drawings and the accompanying description.

Figure 1:
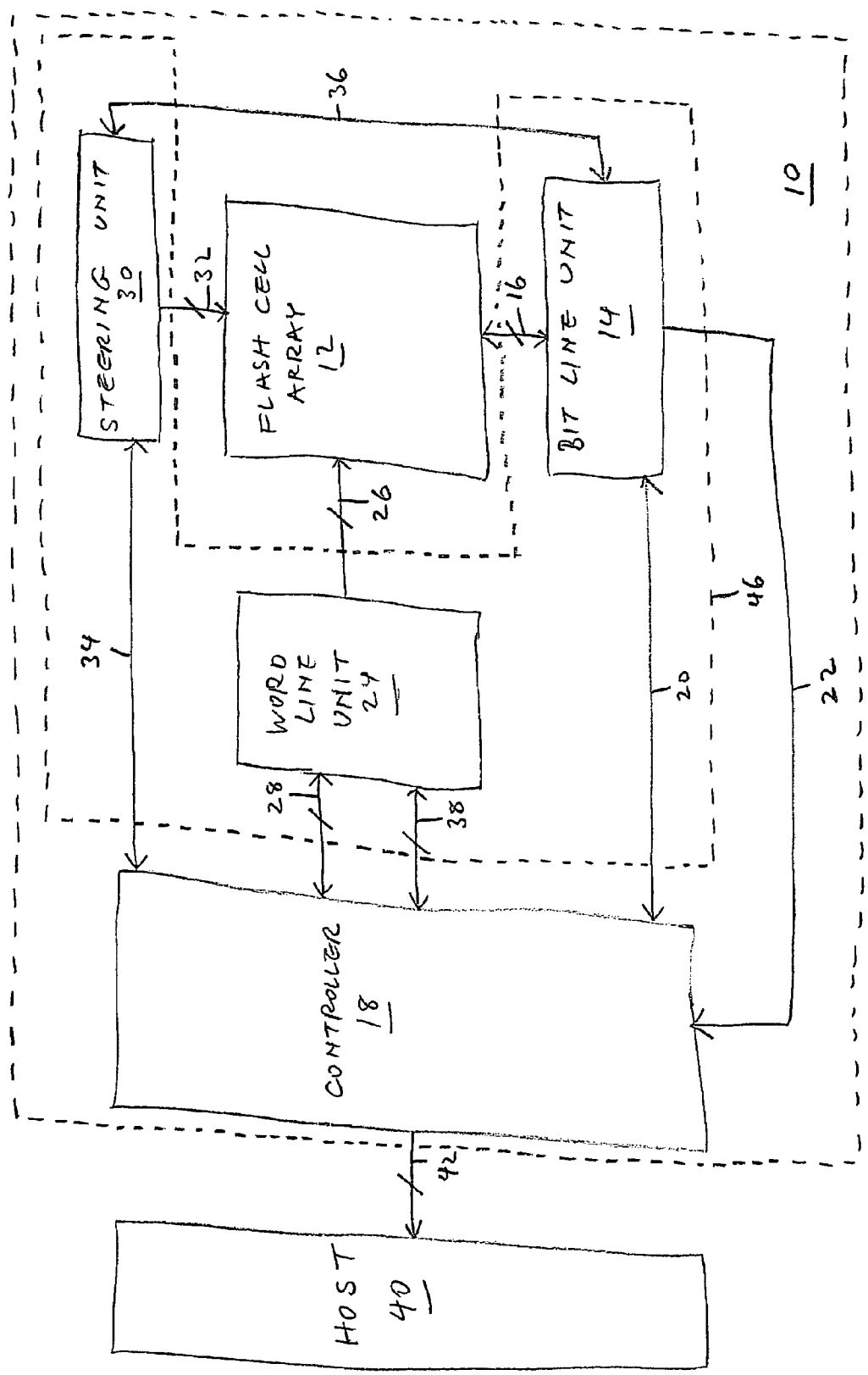
FIG. 1 is a high-level partial block diagram of a self-contained flash memory device, both according to the prior art and according to the present invention.

One innovation of the present invention is the use of STANDARD Flash read operations, but with different (non "standard") reference voltages in order to compute soft bits, based on the results of this reading. To implement this, it is essential, of course, that the memory cell management circuitry of the Flash device support modification of the reference voltages by means of a special command (or a series of such commands), sent by the memory controller. Prior art Flash memory devices usually support this feature "internally", i.e. as a testing and debugging feature, undisclosed (or even disabled) for regular use of the Flash memory device. The possibility of issuing commands for changing the Flash reference voltages, therefore, must be enabled for the controller. Moreover, because, as is shown below, these alternative reference voltages may be computed a-priori and the number of reference voltage bands is limited and depends on the number of soft bits desired to be computed, it is preferred to implement in the Flash memory device one or more special commands that change the entire set of reference voltages and substitute an alternate set of reference voltages for the reference voltages used to read the hard bits. For example, flash memory device 10 of FIG. 1 is modified, according to the present invention, by enabling controller 18 to substitute soft bit reference currents for the reference currents used by bit line unit 14 for reading hard bits.

There is more than one way to compute soft bits by the controller, all of which are applicable to the present invention. All of such methods have similar logic flow for computing soft bits:

The controller performs a standard (hard bit) read of cell data from the Flash memory cell array to obtain the cell state.

The controller performs a series of additional data readings from the Flash memory cell array, instructing the memory cell management circuitry to change reference voltages before each reading.

The controller computes soft bits from the information read from the Flash memory cell array.

Returning now to the drawings, FIG. 3 shows distribution curves of threshold voltages of a two-bit-per-cell MLC flash memory device. The abscissa of FIG. 3 is labeled with reference voltages of the present invention. Three of these reference voltages, $V_1$, $V_2$ and $V_3$, define four hard bit threshold voltage bands: the band below $V_1$, the band between $V_1$ and $V_2$, the band between $V_2$ and $V_3$, and the band above $V_3$. (In the two-bit-per-cell example given above, $V_1=0V$, $V_2=1.5V$ and $V_3=3V$.) A threshold voltage in the first voltage band represents the bit string "11". A threshold voltage in the second voltage band represents the bit string "10". A threshold voltage in the third voltage band represents the bit string "00". A threshold voltage in the fourth voltage band represents the bit string "01". The distribution curves of FIG. 3 are labeled accordingly. Note that this sequence of bit strings is a Gray code: in going from one bit string to the next, only one bit changes.

In a "standard" read of a cell of this MLC flash memory device, the controller issues two commands to the memory cell management circuitry. The first command reads the left bit of the bit string. The second command reads the right bit of the bit string. Within the memory cell management circuitry, the first read is a comparison of the cell threshold voltage to reference voltage $V_2$ and the second read is a comparison of the cell threshold voltage to either reference voltage $V_1$ or to reference voltage $V_3$. The decision of whether to compare the cell threshold voltage to $V_1$ or $V_3$ is internal to the memory cell management circuitry. From the point of view of the controller, the logic of the second hard bit read command is:

threshold voltage<$V_1$: return 1
$V_1$<threshold voltage<$V_3$: return 0
$V_3$<threshold voltage: return 1

One preferred embodiment of the present invention introduces twelve more soft bit reference voltages, labeled $V_{0.25}$, $V_{0.5}$, $V_{0.75}$, $V_{1.25}$, $V_{1.5}$, $V_{1.75}$, $V_{2.25}$, $V_{2.5}$, $V_{2.75}$, $V_{3.25}$, $V_{3.5}$ and $V_{3.75}$ in FIG. 1. The second hard bit read command is generalized to:

threshold voltage<$V_{LO}$: return 1
$V_{LO}$<threshold voltage<$V_{HI}$: return 0
$V_{HI}$<threshold voltage: return 1

Note that in the "standard" second hard bit read command, $V_{LO}=V_1$ and $V_{HI}=V_3$.

To read two soft bits, the second hard bit read command is repeated six times, with the soft bit reference voltages substituted by the controller for $V_1$ and $V_3$ according to the following table, in which the bit returned by repetition i is represented as $R_i$:

| Repetition number | $V_{LO}$ | $V_{HI}$ | Return |
|---|---|---|---|
| 1 | $V_{0.5}$ | $V_{2.5}$ | $R_1$ |

-continued

| Repetition number | $V_{LO}$ | $V_{HI}$ | Return |
|---|---|---|---|
| 2 | $V_{1.5}$ | $V_{3.5}$ | $R_2$ |
| 3 | $V_{0.25}$ | $V_{2.25}$ | $R_3$ |
| 4 | $V_{0.75}$ | $V_{2.75}$ | $R_4$ |
| 5 | $V_{1.25}$ | $V_{3.25}$ | $R_5$ |
| 6 | $V_{1.75}$ | $V_{3.75}$ | $R_6$ |

The controller calculates the first soft bit as:
  NOT ($R_1$ OR $R_2$).

The controller calculates the second soft bit as:
  NOT ($R_3$ OR $R_4$ OR $R_5$ OR $R_6$).

The bit strings that correspond to the soft bit threshold voltage bands defined by the combination of the hard bit reference voltages and the soft bit reference voltages are as in the following table:

| Band number | Low reference voltage | High reference voltage | Bit string |
|---|---|---|---|
| 1 | | $V_{0.25}$ | 1111 |
| 2 | $V_{0.25}$ | $V_{0.5}$ | 1110 |
| 3 | $V_{0.5}$ | $V_{0.75}$ | 1100 |
| 4 | $V_{0.75}$ | $V_1$ | 1101 |
| 5 | $V_1$ | $V_{1.25}$ | 1001 |
| 6 | $V_{1.25}$ | $V_{1.5}$ | 1000 |
| 7 | $V_{1.5}$ | $V_{1.75}$ | 1010 |
| 8 | $V_{1.75}$ | $V_2$ | 1011 |
| 9 | $V_2$ | $V_{2.25}$ | 0011 |
| 10 | $V_{2.25}$ | $V_{2.5}$ | 0010 |
| 11 | $V_{2.5}$ | $V_{2.75}$ | 0000 |
| 12 | $V_{2.75}$ | $V_3$ | 0001 |
| 13 | $V_3$ | $V_{3.25}$ | 0101 |
| 14 | $V_{3.25}$ | $V_{3.5}$ | 0100 |
| 15 | $V_{3.5}$ | $V_{3.75}$ | 0110 |
| 16 | $V_{3.75}$ | | 0111 |

Note that this sequence of bit strings also is a Gray code.

It will be apparent to those skilled in the art how to read more than two soft bits per cell and how to extend this example to MLC flash memory devices with more than two bits per cell.

Another preferred embodiment of the present invention introduces only the nine soft bit reference voltages that exceed $V_1$. The controller performs four full readings of both hard bits of the cell. The first full reading uses the hard bit reference voltages $V_1$, $V_2$ and $V_3$. Before the second full reading, the controller shifts the threshold voltage bands up by one-half of a band relative to the default hard bit bands by substituting $V_{1.5}$, $V_{2.5}$ and $V_{3.5}$ for $V_1$, $V_2$ and $V_3$. Before the third full reading, the controller shifts the threshold voltage bands up by one-quarter of a band relative to the default hard bit bands by substituting $V_{1.25}$, $V_{2.25}$ and $V_{3.25}$ for $V_1$, $V_2$ and $V_3$. Before the fourth full reading, the controller shifts the threshold voltage bands up by three-quarters of a band relative to the default hard bit bands by substituting $V_{1.75}$, $V_{2.75}$ and $V_{3.75}$ for $V_1$, $V_2$ and $V_3$. Note that in a flash memory device in which cells are read individually, the controller can decide, based on the second full reading, whether to skip either the third full reading or the fourth full reading. In a flash memory device such as a NAND flash memory device in which cells are read collectively (e.g. an entire word line at a time), all four full readings are needed.

Two soft bits then are defined by the controller as in the following pseudocode:

If the results of the second read differ from the results of the first read then:
  The first soft bit is "1".
  If the results of the third read differ from the results of the first read then:
    The second soft bit is "1"
  Else
    The second soft bit is "0"
Else
  If the results of the fourth read differ from the results of the first read then:
    The second soft bit is "1"
  Else
    The second soft bit is "0"

Note that the resulting sequence of bit strings is not a Gray code. Note also that this embodiment does not compute "soft" bits for the erased state. If soft bits for the erased state are needed, the controller shifts the threshold voltage bands downward and performs additional full readings.

As in the case of the first preferred embodiment, it will be apparent to those skilled in the art how to read more than two soft bits per cell and how to extend this example to MLC flash memory devices with more than two bits per cell.

It should be noted that the methods of the present invention may be used either unconditionally or only when needed. By "unconditionally" t is meant that every reading of the memory always includes the additional readings required for generating soft bits, and the ECC always uses soft bits in recovering the data. By "only when needed" is meant that by default only the initial regular reading is done, and only if reliability of data read is not good enough do we go into further readings of the cells in order to generate soft bits and allow the ECC to correct the data.

It should also be emphasized that an important advantage of the methods of the present invention is that all reading operations, including the reading operations that are executed for generating the soft bits, are all done using standard read commands. By a "standard" read command is meant a command for reading data from a memory device that is used for reading data stored in the device without using or referring to soft bits. The reading of data using soft bits may involve commands for setting values of reference voltages in the memory device, but as long as all reading operations are done using the standard commands and not soft bit specialized commands, the device is still considered as using only standard commands for reading.

Another feature of the methods of the present invention that is to be emphasized is that the memory cell management circuitry has no need to internally store the values of the hard bits after the hard bits had been read out to the controller. In other words, while carrying out the operations that eventually generate the soft bits (i.e. the additional reading operations that use non-default reference voltages), the cell management circuitry has no need to "remember" what the hard bits were and its operation is not dependent on their values. The values of the hard bits need only be stored in the external flash memory controller that issues the various reading commands and calculates the soft bits. This feature of the present invention is a great advantage as it allows the generation of soft bits with practically no increase in the flash memory device silicon area and cost, as no buffers are needed for storing previous data values while making readings for the purpose of generating soft bits.

Figure 2:
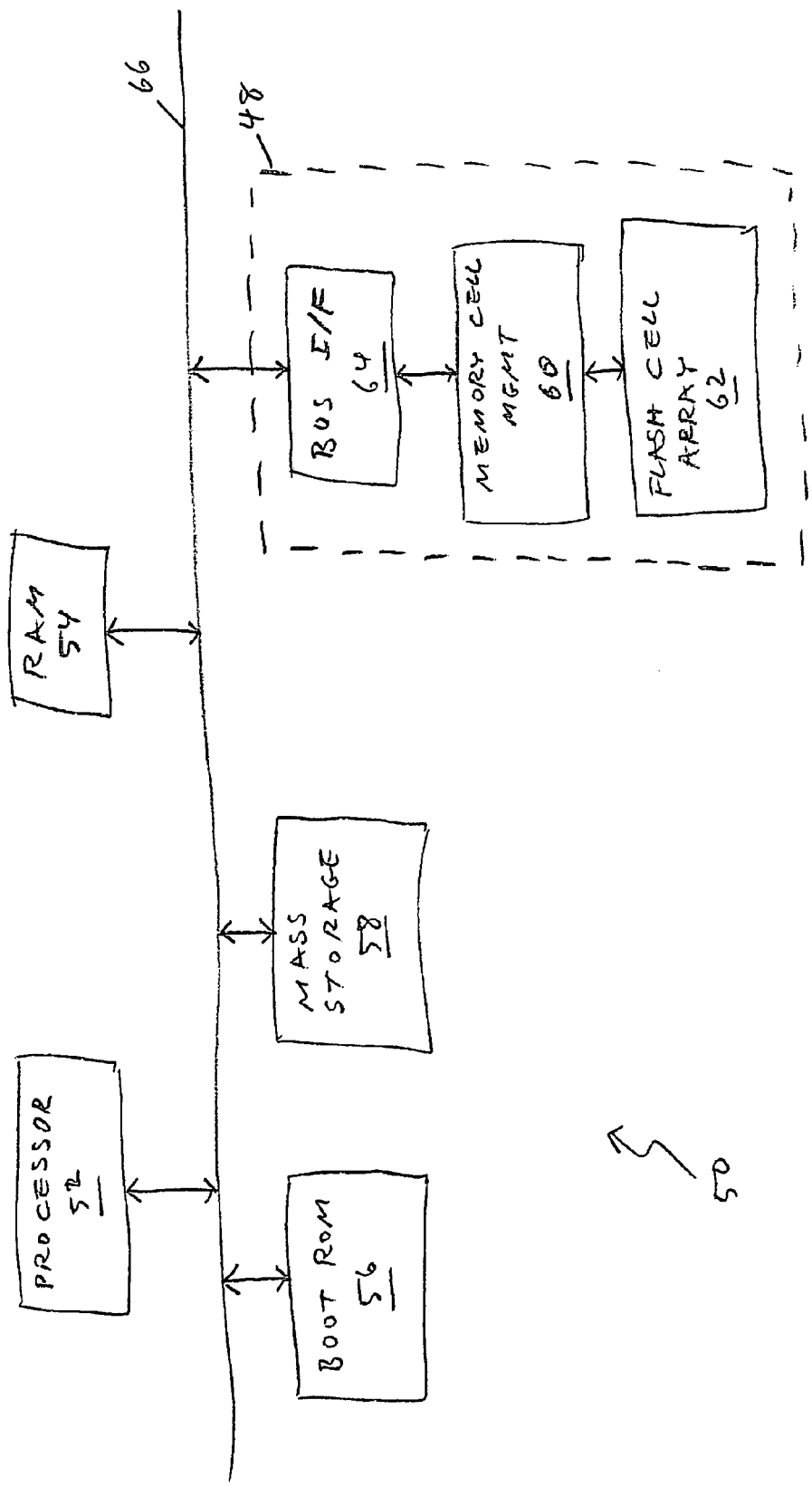
FIG. 2 is a high-level partial block diagram of a data storage system, both according to the prior art and according to the present invention.

FIGS. 1 and 2, in addition to illustrating a prior art flash memory device and a prior art data storage system, also illustrate a flash memory device of the present invention and a data storage system of the present invention, with the understanding that controller 18 is modified according to the principles of the present invention and that the software driver executed by processor 52 is modified according to the principles of the present invention.

While the invention has been described with respect to a limited number of embodiments, it will be appreciated that many variations, modifications and other applications of the invention may be made.

What is claimed is:

1. A method of reading information stored as a respective physical state of at least one cell of a memory, the method comprising the steps of:
   (a) setting each of at least one reference to a respective member of a first set of values;
   (b) reading the respective physical state of each cell wherein the information is stored according to said first set of values;
   (c) subsequent to said reading of the respective physical state of each cell according to said first set of values: setting each of at least a portion of said at least one reference to a respective member of a second set of values; and
   (d) reading the respective physical state of each cell wherein the information is stored according to said second set of values;
   wherein at least one member of said second set is different from any member of said first set, so that said reading of the at least one physical state according to said first set and said reading of the at least one physical state according to said second set together read the at least one physical state with higher resolution than said reading of the at least one physical state according to said first set alone.

2. The method of claim 1, wherein said reading according to said first set of values and said reading according to said second set of values are effected using a common reading mechanism.

3. The method of claim 1, wherein said setting of each of said at least portion of the at least one reference to said respective member of said second set of values is effected by issuing commands to the memory from outside the memory.

4. The method of claim 1, wherein every member of said second set is different from any member of said first set.

5. The method of claim 1, further comprising the step of: prior to said reading according to said first set of values:
   (e) writing the information to the at least one cell according to said first set of values.

6. The method of claim 1, wherein said setting of each of said at least portion of the at least one reference and said reading according to said second set of values are iterated, and wherein, in each iteration subsequent to a first iteration, at least one member of said second set of values is different from any member of said second set of values in any preceding iteration.

7. The method of claim 6, wherein, in each said iteration subsequent to said first iteration, every member of said second set is different from any member of said second set in any preceding iteration.

8. The method of claim 6, further comprising the step of:
   (e) assigning a bit pattern to each of a plurality of intervals defined by said first set of values, such that said bit patterns together constitute a first Gray code, so that said reading according to said first set of values expresses the information stored in each cell as a respective said bit pattern of said first Gray code;
   wherein said setting of each of said at least portion of the at least one reference and said reading according to said second set of values are iterated a sufficient number of times to transform said first Gray code into a second Gray code with a greater number of bits than said first Gray code, with the respective physical state of each cell then being expressed as a respective bit pattern of said second Gray code.

9. The method of claim 1, wherein said second set of values includes as many members as said first set of values.

10. The method of claim 9, further comprising the steps of:
    (e) setting one of the at least one reference to a third value different from any members of said first and second sets; and
    (f) reading the at least one physical state according to said third value.

11. The method of claim 1, wherein, if said first set includes N said members, then said second set includes (N+1)/2 said members.

12. The method of claim 1, further comprising the steps of:
    (e) interpreting results of both said reading according to said first set and said reading according to said second set to recover the information.

13. A memory device comprising:
    (a) at least one cell for storing information as a respective physical state thereof; and
    (b) a controller operative to read said information by:
       (i) setting each of at least one reference to a respective member of a first set of values,
       (ii) reading said respective physical state of said each cell, wherein said information is stored, according to said first set of values,
       (iii) subsequent to said reading of said respective physical state of said each cell according to said first set of values: setting each of at least a portion of said at least one reference to a respective member of a second set of values, and
       (iv) reading said respective physical state of said each cell, wherein said information is stored, according to said second set of values;
    wherein at least one member of said second set is different from any member of said first set, so that said reading of said at least one physical state according to said first set and said reading of said at least one physical state according to said second set together read the at least one physical state with higher resolution than said reading of said at least one physical state according to said first set alone.

14. A system comprising:
    (a) a memory that includes at least one cell for storing information as a respective physical state thereof; and
    (b) a processor operative to read said information by:
    (i) setting each of at least one reference to a respective member of a first set of values,
       (ii) reading said respective physical state of said each cell, wherein said information is stored, according to said first set of values,
       (iii) subsequent to said reading of said respective physical state of said each cell according to said first set of values: setting each of at least a portion of said at least one reference to a respective member of a second set of values, and
       (iv) reading said respective physical state of said each cell, wherein said information is stored, according to said second set of values;
    wherein at least one member of said second set is different from any member of said first set, so that said reading of said at least one physical state according to said first set and said reading of said at least one physical state according to said second set together read the at least one physical state with higher resolution than said reading of said at least one physical state according to said first set alone.

15. A method of reading information stored as a respective physical state of at least one cell of a memory, the method comprising the steps of:
   (a) configuring the memory to store, for each cell, at most N>1 bits that are representative of the physical state of said each cell; and
   (b) for each cell wherein the information is stored:
      (i) storing in the memory a respective N first bits that represent the respective physical state of said each cell according to a first set of at least one reference value, and
      (ii) replacing, within the memory, at least a portion of said N first bits with at least one second bit that is representative of the physical state of said each cell according to a second set of at least one reference value, at least one member of said second set being different from any member of said first set, said N first bits and said at least one second bit together representing the physical state of said each cell with higher resolution than said N first bits alone.

16. A memory device comprising:
   (a) a memory including:
      (i) at least one cell for storing information as a respective physical state thereof, and
      (ii) memory cell management circuitry for storing, for each cell, at most a respective $N \geq 1$ bits that represent said respective physical state according to a set of at least one reference; and
   (b) a controller for
      (i) setting each of said at least one reference to a respective member of a first set of at least one value,
      (ii) subsequent to said setting of each said at least one reference to said respective member of said first set: for each said cell wherein said information is stored: reading said N respective bits,
      (iii) setting each of at least a portion of said at least one reference to a respective member of a second set of at least one value, at least one member of said second set being different from any member of said first set, and
      (iv) subsequent to said setting of each of at least said portion of said at least one reference to said respective member of said second set: for each cell wherein said information is stored: reading at least one of said N respective bits,
   thereby obtaining, for each cell wherein said information is stored, a representation of said respective physical state of higher resolution than a representation of said respective physical state according to only N bits.

17. A system comprising:
   (a) a memory including:
      (i) at least one cell for storing information as a respective physical state thereof, and
      (ii) memory cell management circuitry for storing, for each cell, at most a respective $N \geq 1$ bits that represent said respective physical state according to a set of at least one reference; and
   (b) a processor for:
      (i) setting each of said at least one reference to a respective member of a first set of at least one value,
      (ii) subsequent to said setting of each said at least one reference to said respective member of said first set:
      for each said cell wherein said information is stored: reading said N respective bits,
      (iii) setting each of at least a portion of said at least one reference to a respective member of a second set of at least one value, at least one member of said second set being different from any member of said first set, and
      (iii) subsequent to said setting of each of at least said portion of said at least one reference to said respective member of said second set: for each cell wherein said information is stored: reading at least one of said N respective bits,
   thereby obtaining, for each cell wherein said information is stored, a representation of said respective physical state of higher resolution than a representation of said respective physical state according to only N bits.

18. A method of reading information stored as a respective physical state of at least one cell of a memory, the method comprising the steps of:
   (a) configuring the memory to return, for each cell, in response to at least one read command, at most $N \geq 1$ bits that are representative of the physical state of said each cell;
   (b) setting each of at least one reference to a respective member of a first set of values;
   (c) issuing at least one of said at least one read command to obtain, for each cell, a first N bits that are representative of the physical state of said each cell according to said first set;
   (d) setting each of at least a portion of said at least one reference to a respective member of a second set of values, at least one member of said second set being different from any member of said first set; and
   (e) issuing at least one of said at least one read command to obtain, for each cell, at least one second bit that is representative of the physical state of said each cell according to said second set, said N first bits and said at least one second bit together representing the physical state of said each cell with higher resolution than said N first bits alone.

19. A memory device comprising:
   (a) a memory including:
      (i) at least one cell for storing information as a respective physical state thereof, and
      (ii) memory cell management circuitry for returning, in response to at least one read command, at most $N \geq 1$ respective bits that represent said physical state of each said cell, wherein said information is stored; and
   (b) a controller for:
      (i) setting each of at least one reference to a respective member of a first set of values,
      (ii) issuing at least one of said at least one read command to obtain, for each cell wherein said information is stored, a first N bits that are representative of said physical state of said each cell according to said first set,
      (iii) setting each of at least a portion of said at least one reference to a respective member of a second set of values, at least one member of said second set being different from any member of said first set, and
      (iv) issuing at least one of said at least one read command to obtain, for each cell wherein said information is stored, at least one second bit that is representative of said physical state of said each cell according to said second set,
   thereby obtaining, for each cell wherein said information is stored, a representation of said respective physical state of higher resolution than a representation of said respective physical state according to only said first N bits.

20. A system comprising:

(a) a memory including:
  (i) at least one cell for storing information as a respective physical state thereof, and
  (ii) memory cell management circuitry for returning, in response to at least one read command, at most $N \geq 1$ respective bits that are representative of said physical state of each said cell wherein said information is stored; and (b) a processor for:
  (i) setting each of at least one reference to a respective member of a first set of values,
  (ii) issuing at least one of said at least one read command to obtain, for each cell wherein said information is stored, a first N bits that are representative of said physical state of said each cell according to said first set,
  (iii) setting each of at least a portion of said at least one reference to a respective member of a second set of values, at least one member of said second set being different from any member of said first set, and
  (iv) issuing at least one of said at least one read command to obtain, for each cell wherein said information is stored, at least one second bit that is representative of said physical state of said each cell according to said second set thereby obtaining, for each cell wherein said information is stored, a representation of said respective physical state of higher resolution than a representation of said respective physical state according to only said first N bits.

* * * * *

UNITED STATES PATENT AND TRADEMARK OFFICE
CERTIFICATE OF CORRECTION

PATENT NO. : 7,502,254 B2  Page 1 of 1
APPLICATION NO. : 11/651483
DATED : March 10, 2009
INVENTOR(S) : Murin et al.

It is certified that error appears in the above-identified patent and that said Letters Patent is hereby corrected as shown below:

Column 15, line 10; delete "$N>1$" and insert --$N \geq 1$--.

Signed and Sealed this

Twenty-eighth Day of April, 2009

JOHN DOLL
*Acting Director of the United States Patent and Trademark Office*